United States Patent [19]

Shiota et al.

[11] Patent Number: 4,970,197
[45] Date of Patent: Nov. 13, 1990

[54] OXIDE SUPERCONDUCTOR

[75] Inventors: Takao Shiota, Sakura; Hiroshi Hidaka, Tsukuba; Koichi Takahashi, Funabashi; Masahiro Sato, Yotsukaido; Osamu Fukuda, Narashino, all of Japan

[73] Assignee: Fujikura Ltd., Tokyo, Japan

[21] Appl. No.: 185,686

[22] Filed: Apr. 22, 1988

[30] Foreign Application Priority Data

Apr. 22, 1987 [JP] Japan .................................. 62-99351
Jun. 12, 1987 [JP] Japan ................................. 62-146484
Jul. 7, 1987 [JP] Japan .................................. 62-169122

[51] Int. Cl.$^5$ .............................................. B32B 9/00
[52] U.S. Cl. ....................................... 505/1; 505/701; 505/702; 505/704; 428/688; 428/698; 428/930; 29/599
[58] Field of Search ................... 505/1, 701, 702, 704, 505/811–813; 428/688, 698, 930; 29/599

[56] References Cited

U.S. PATENT DOCUMENTS

H39 3/1986 Gubser et al. .................... 505/816

OTHER PUBLICATIONS

Development of Anti-Thermal and High Strength Hermetically Coated Optical Fiber; Shigenobu Tanaka, et al., Fujikura Technical Review, 1986, pp. 11–22.
Environmental and Solvent Effects on $Y_1Ba_2Cu_3O_x$, Frase et al., Adv. Cer. Matl., vol. 2, No. 3B, Jul. 1987.
Y-Ba-Cu-O/Nb Tunnel Type Josephson Junctions, Inoue et al., Jap. Journ. Appl. Phys., vol. 26, No. 9 (9-87), pp. L1443–L1444.

*Primary Examiner*—Patrick Ryan
*Attorney, Agent, or Firm*—Oblon, Spivak, McClelland, Maier & Neustadt

[57] ABSTRACT

An oxide superconductor including an oxide superconductor member and a hermetical seal layer, coated over the oxide superconductor member, for hermetically sealing the oxide superconductor member from the atmosphere.

8 Claims, 3 Drawing Sheets

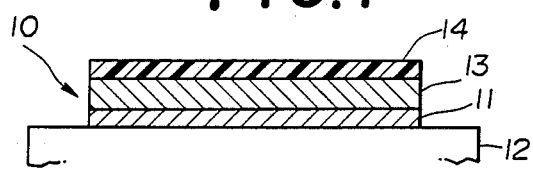
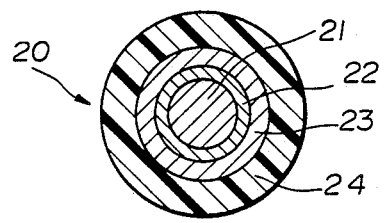

FIG. 8
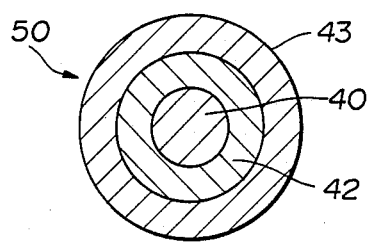
FIG. 9  FIG. 10  FIG. 11
 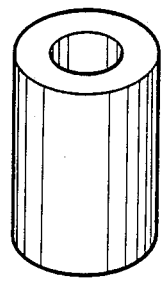 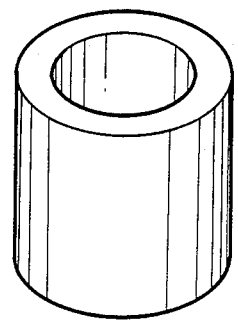

OXIDE SUPERCONDUCTOR

BACKGROUND OF THE INVENTION

The present invention relates to an oxide superconductor which may be used for coils of superconductor magnets, superconducting cables and superconductor devices such as superconductor memory.

Recently, various oxide superconductors which exhibit very high critical temperatures (Tc) have been discovered. For producing a thin film of an oxide superconductor of, for example, a Ba-La-Cu-O system, attempts have been made by forming the thin film on a substrate of sapphire or other conventional materials. Such a superconductor has been formed by high frequency sputtering, using a target made of the superconductor material, or other conventional techniques.

Superconductors thus formed are exposed to the atmosphere and hence have, a problem in that their performance deteriorates over a period of time since oxygen in them escapes into the atmosphere, and since components, such as vapor, of the atmosphere react with them.

Accordingly, it is an object of the present invention to provide an oxide superconductor which reduces the above drawback.

SUMMARY OF THE INVENTION

With this and other objects in view, the present invention provides an oxide superconductor comprising: an oxide superconductor member; and a hermetic seal layer, coated over the oxide superconductor member, for hermetically sealing the oxide superconductor member from the atmosphere, the seal layer being free of a material which reacts with the superconductor to deteriorate considerably the performance of the superconductor.

With such a sealing layer, oxygen in the superconductor is prevented from escaping from it and the superconductor is protected against reaction with adverse components of the atmosphere. Thus, the oxide superconductor provides a stable superconductivity performance for a long period of time without deteriorating it.

The hermetic seal layer may be preferably made of a substance selected from the group consisting of Au, Ag, Cu, Al, In, $SiO_2$, $SiO_3N_4$, and $SiO_xN_y$ where $0<x<2$ and $0<y<1$. The hermetic seal layer made of such substances is stable against components of the atmosphere, such as $O_2$ and $H_2O$, and does not substantially react with elements of the superconductor member. Preferably, $1.4<x<1.8$ and $0.2<y<0.6$. $SiO_3N_4$ and $SiO_xN_y$ are particularly suitable for the hermetic seal layer in view of their fairly low gas permeability.

The oxide superconductor may be represented by a formula $A_xB_yCu_zO_{9-\delta}$ where: A includes at least one element selected from the group consisting of Sc, Y, La, Ce, Pr, Nd, Pm, Sm, Eu, Gd, Tb, Dy, Ho, Er, Tm, Yb and Lu; B includes at least one element selected from the group consisting of Be, Sr, Mg, Ca, Ba and Ra; $0.1<x<2.0$; $1<y<3$; $1<z<3$; and $0<\delta<7$.

BRIEF DESCRIPTION OF THE DRAWINGS

In the drawings:

FIG. 1 is a side view partly in section of an oxide superconductor of the present invention, using an oxide superconductor thin film;

FIG. 2 is a cross-sectional view of an superconductor cable according to the present invention;

DETAILED DESCRIPTION OF THE PREFERRED EMBODIMENTS

Figure 3:
FIGS. 3 to 6 are axial sectional views illustrating how to fabricate another superconducting cable according to the present invention.

Referring to FIG. 1, reference number 10 designates an oxide superconductor having an oxide superconductor thin film 11 coated over a substrate 12 made of Si by sputtering. The outer surface of the thin film 11 is coated with a hermetic seal layer 13 for preventing gases in the atmosphere from entering into the thin film 11. The outer surface of the sealing layer 13 is coated with a protection layer 14 for protecting the sealing layer 13 from physical damages.

The oxide superconductor thin film may be made of various oxide superconductors previously named by sputtering and other conventional techniques and may have a thickness of about 0.01 to about 2 μm.

The sealing layer 13 and the protection layer 14 may be made of various materials previously mentioned by conventional sputtering, chemical vapor deposition (CVD) and other conventional techniques and may have a thickness of about 0.1 to about 1 μm.

The protection layer 14 may be made of silicone, an organic compound, such as ultraviolet-setting epoxy acrylate resin, urethane acrylate resin and similar materials.

FIG. 2 illustrates an oxide superconductor cable 20 of the present invention, in which a fiber 21, made of Cu, $Al_2O_3$, $SiO_2$, or the other similar conventional material, is coated with an oxide superconductor thin film 22 by sputtering. The ceramic fiber 21 may have a diameter of about 0.2 to about 2 mm. Coated over the thin film 22 is a hermetic seal layer 23, over which is coated a protection layer 24 preferably having a thickness of about 100 μm to about 400 μm. The protection layer 24 may be made of the same material as that of the preceding embodiment. Oxide superconductor cables have been proposed in a copending U.S. patent application, filed on Apr. 6, 1988, entitled "OXIDE SUPERCONDUCTOR CABLE AND METHOD OF PRODUCING THE SAME", in the name of some of the inventors and claiming priority from Japanese Patent Application Nos. 62-85152, 62-85153 and 62-85154 and 62-105570, and which disclosure is incorporated herein by reference.

Figure 4:
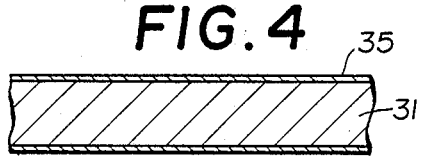
Figure 5:
Figure 6:
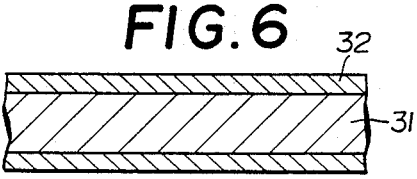
Figure 7:
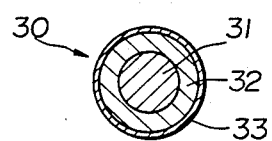
FIG. 7 is a cross-sectional view of the superconducting cable fabricated according to the process illustrated in FIG. 3 to 6.

FIGS. 3 to 7 illustrate how to fabricate another superconducting cable 30 in a manner modified from that in FIG. 2. A first thin film 34 made of a starting material of an oxide superconductor is coated over a filament 31 which may be made of the same substance as the filament 21 in FIG. 2.

The starting material may be an alloy of A-B-Cu system where : A includes at least one element selected from the group consisting of Sc, Y, La, Ce, Pr, Nd, Pm, Sm, Eu, Gd, Tb, Dy, Ho, Er, Tm, Yb and Lu; B includes at least one element selected from the group consisting of Be, Sr, Mg, Ca, Ba and Ra.

The first thin film 34 may be made by the same technique as in the preceding embodiments and preferably has a thickness of about 2 to about 200 nm although the thickness may be outside this range. With the upper limit of about 200 nm, oxygen from the atmosphere is easily diffused into the first thin film 34, thus uniformly oxidizing it to form an excellent superconducting thin film.

The oxidation of the first thin film 34 may be carried out by conventional techniques such as proposed in the copending U.S. patent application, for example, thermal oxidation technique, in which the thin film 34 is heated in an oxygen atmosphere, and plasma oxidation technique in which the thin film 34 is treated in plasma. In these techniques, the substrate 31 is heated typically below about 800° C. to about 1000° C. At a temperature above about 1000° C., elements of the thin film 34 is liable to diffuse into the substrate. Particularly in the thermal oxidation technique, the thickness of the thin film 34 may be increased when the oxidizing time or the oxygen diffusion time is sufficiently long. The diffusion time is preferably 0.2 to 20 hours. The thickness of the thin film 34 may be also increased by raising the activated oxygen partial pressure in the oxygen atmosphere, which preferably includes about 20 to about 60% of oxygen.

Subsequently, a second thin film of the same starting material of the oxide superconductor is coated over the superconductor thin film 35 in the same manner as in the first thin film 34. The second thin film 36 is oxidized in the same manner as in the superconducting thin film 36 to form a second oxide superconductor thin film. Thus, the two thin films 35 and 36 form into an oxide superconductor thin film 32 which includes two united oxide superconductor thin films. By repeating the above procedures, that is, the coating of the starting material layer and the oxidation thereof, a predetermined number of times, there is provided an integrated oxide superconductor layer of a predetermined thickness, which layer is then subjected to conventional heat treatment for obtaining excellent crystal structure to strengthen adhesion between the stacked oxide superconductor thin films.

A hermetical seal layer 33 may be formed as in the embodiment in FIG. 2. Alternatively, a protection sheath may be placed over the oxide superconductor layer 32 in place of the hermetical seal layer 33.

The procedures in FIGS. 3 to 7 enable accurate control of the thickness of each oxide superconductor thin film thus providing an oxide superconductor having high dimensional accuracy.

Referring to FIG. 8, there is illustrated another superconductor cable according to the present invention which cable has an oxide superconductor fiber 40, over which is formed an intermediate layer 42, over which is in turn formed an outer hermetic seal layer 43.

The oxide superconductor fiber 40 may be made of various oxide superconductors previously named. The intermediate layer 42 may have a thickness from about 0.1 to about 2 $\mu$m and may be made of various kinds of amorphous material also represented by the formula of the superconductor material $A_xB_yCuO_z$ or $A_x\text{-}B_yCuO_zX_w$ where preferably $0.2<x<0.6$, $0.3<y<0.7$, $2<z<6$ and $0.1<w<1$ and X includes F, Cl, Br, I or At. The outer hermetic sealing layer 43 may be made of a vitreous material represented by the formula $A_x\text{-}B_yCuSi_zO_v$, where typically, $0.2<x<0.5$, $0.9<y<b\ 2$, $2<z<4$ and $4<v<10$, or the formula $A_xB_yCuSi_zO_vX_w$ where typically, $0.2<x<0.5$, $1<y<2$, $1.2<z<4$, $5<v<10$ and $0.1<w<1$. The operating point is preferably within the range from 900° C. to 1200° C. The thickness of the outer layer 43 is typically from about 0.2 to about 2 $\mu$m. The lower limit depends on degree of protection against the entering gases from the atmosphere and the upper limit is given by necessary bend performance of the cable.

The superconductor cable of the present invention with such a structure provides the sealing layer with excellent electrical and thermal insulation and resistance against separation from the cable. The superconductor cable may be fabricated by rod-in-tube technique, powder charge drawing technique and other conventional methods.

In the rod-in-tube technique, a cylindrical compact as illustrated in FIG. 9 is prepared by compression molding a powder of an oxide superconductor, represented by the above formulas or raw material powder of such superconductor, and then sintering it. A hollow cylindrical amorphous compact as in FIG. 10 may be prepared by heating a compound powder represented by the above formulas or raw material powder of such a compound at about 1000° C., then hot rolling it at about 700° C. to about 500° C. The amorphous compact has such an inner diameter that the superconductor compact may be inserted into it. A hollow vitreous molding as in FIG. 11 may be prepared by conventional powder mixture melting technique, which is widely carried out in melting glasses, using the above mentioned vitreous material. The inner diameter of the vitreous molding is formed in such a size that the amorphous compact may be inserted into it. The superconductor fiber is inserted into the amorphous compact, which is in turn placed into the vitreous molding to form an assembly. The assembly may be drawn by conventional technique preferably at a speed of about 2 to about 20 m/min during heating at about 600° C. to 800° C. to produce a superconductor cable.

When the superconductor cable is produced by conventional powder charge drawing technique, a vitreous tube of the same material as the hollow cylindrical vitreous molding is prepared and then an amorphous layer of the same material as the amorphous compact is formed over the inner face of the vitreous tube. Subsequently, a superconductor powder or a raw material powder of the same composition as the superconductor compact is charged into the vitreous tube with the amorphous layer and then the vitreous tube is drawn preferably at a speed of about 2 to about 20 m/min by conventional drawing technique during heating at 600° C. to 800° C. to form the superconductor cable.

EXAMPLE 1

A 1.2 $\mu$m thick $Y_{0.3}Ba_{0.7}CuO_4$ superconductor thin film was coated over one face of a sapphire substrate having 2 inches diameter and 450 $\mu$m thickness by sputtering a superconducting material of $Y_{0.3}Ba_{0.7}CuO_x$ in an atmosphere, including 70% of Ar and 30% of $O_2$, at $3\times10^{-3}$ Torr with the substrate at 450° C. Then, a 0.5 $\mu$m hermetic seal layer of $SiO_{1.2}N_{0.5}$ was coated over the superconductor thin film by using a gas mixture including $SiH_4$ (20 cc/min), $NH_3$ (50 cc/min), $H_2$ (carrier gas, 200 cc/min) and $O_2$ (5 cc/min) at a reaction temperature of 800° C. Subsequently, a 150 $\mu$m protection layer was formed on the seal layer by applying an epoxy acrylate resin to the latter and then by irradiating ultraviolet rays to it. With such procedures, specimens were prepared and placed in the atmosphere and in liquid nitrogen. These specimens were measured in critical temperature in specified periods of time and the results are given in Table 1.

COMPARATIVE TEST

Specimens were prepared by the same conditions except that no hermetic seal layer was formed and were also measured in critical temperature. The results are given in Table 1, from which it is noted that the specimen placed in the atmosphere considerably degraded in critical temperature.

TABLE 1

|  | Example 1 | Comparative |
| --- | --- | --- |
| initial | 30K | 34K |
| in the atmosphere after one day | 30K | 30K |
| in the atmosphere after one month | 30K | 25K |
| in liquid nitrogen after one month | 30K | 30K |

EXAMPLE 2

A 0.4 μm thick superconductor thin film of $La_{0.3}Ba_{0.7}CuO_4$ was formed over a Cu filament having 0.3 mm diameter by sputtering superconducting material $La_{0.3}Ba_{0.7}CuO_x$ by means of a double-hollow cylinder type sputtering apparatus. Then, a 0.5 μm thick $SiO_{1.4}N_{0.6}$ hermetic sealing layer was formed over the superconductor thin film by CVD using similar gas mixture in Example 1 and at a reaction temperature of 1000° C. Subsequently, a 400 μm thick vinyl chloride protection film was coated over the sealing layer. Specimens thus prepared were subjected to the same tests as in Example 1. It was confirmed that critical temperatures of the specimens were 30K and did not depend on time within one month.

EXAMPLE 3

A powder of $Y_{0.3}Ba_{0.7}CuO_x$ was prepared by mixing fine powders of Y, Ba and Cu, and then oxidizing it. The oxidized powder was then compressed at pressure of 150 kg/cm² to form a cylinder, which was heated at 1000° C. for 5 hours and then annealed at 600° C. for 10 hours to produce a cylindrical superconductor compact of $Y_{0.3}Ba_{0.7}CuO_4$, having 10 mm diameter and 40 mm length. $Y_{0.3}Ba_{0.7}CuO_x$ powder was prepared in the same manner and formed by hot rolling at pressure of 150 kg/cm² at 850° C. into a hollow cylindrical $Y_{0.3}Ba_{0.7}CuO_5$ amorphous compact having a 15 mm outer diameter, 10.2 mm inner diameter and 40 mm long. A hollow cylindrical $Y_{0.4}Ba_{0.6}Cu_{0.4}Si_{1.6}O_6$ vitreous compact was prepared by powder mixing melting technique in which a powder mixture was melted in the atmosphere, including Ar and $O_2$, at pressure of 0.3 Kg/mm2 at 1200° C. and then gradually cooled. The vitreous molding had a transition point of 780° C. and an operation point of 1000 to 1200° C. and its size was 20 mm in outer diameter, 15.2 mm in inner diameter and 40 mm in length. These three parts are arranged as illustrated in FIG. 8 to form an assembly, which was heated in a conventional platinum crucible furnace, from which bottom it was spun and pulled out into a superconductor fiber having 200 um outer diameter and a superconductor core of 100 μm diameter. The superconductor fiber has 60 mm minimum bend radius, a critical temperature of 90K, critical current 400 A/cm² at 77K. It was confirmed that no separation of the intermediate and outer sealing layers occurred below the critical temperature.

What is claimed is:

1. An oxide superconductor comprising;
   (a) a high critical temperature (TC) oxide superconductor member; and
   (b) a hermetically sealing layer, coated over the oxide superconductor member, for hermetically sealing the oxide superconductor member from the atmosphere wherein the sealing layer is made of a substance selected from the group consisting of Au, Ag, Cu, Al, In, $SiO_2$, and $SiO_3N_4$.

2. An oxide superconductor as recited in claim 1, wherein the thickness of the sealing layer ranges from about 0.1 μm to about 4 μm.

3. An oxide superconductor as recited in claim 2, wherein the oxide superconductor is represented by a first formula: $A_xB_yCu_zO_{9-\delta}$ where: A includes at least one element selected from the group consisting of Sc, Y, La, Ce, Pr, Nd, Pm, Sm, Eu, Gd, Tb, Dy, Ho, Er, Tm, Yb and Lu; B includes at least one element selected from the group consisting of Be, Sr, Mg, Ca, Ba and Ra; about $0.1 < x <$ about 2.0; about $1 < y <$ about 3; about $1 < z <$ about 3; and about $0 < \delta <$ about 7.

4. An oxide superconductor as recited in claim 3, wherein the oxide superconducting member comprises a substrate, and an oxide superconductor layer containing the oxide superconductor and coated over the substrate, the oxide superconductor layer having a thickness of about about 0.01 μm to about 2 μm.

5. An oxide superconductor as recited in claim 4, further comprising a coating layer coated over the sealing layer for protecting the sealing layer from physical damage.

6. An oxide superconductor as recited in claim 4, wherein the sealing layer comprises: an amorphous intermediate sealing layer containing the elements A, B, Cu and O; and a vitreous outer sealing layer containing the elements A, B, Cu and 0.

7. An oxide superconductor as recited in claim 6, wherein the intermediate amorphous sealing layer has a thickness of about 0.1 μm to about 2 μm and comprises an amorphous substance represented by a second formula $A_{x1}B_{y1}CuO_{z1}$ where about $0.2 < x1 <$ about 0.6, about $0.3 < y1 <$ about 0.7, about $2 < z1 <$ about 6, and wherein the outer vitreous sealing layer has a thickness of about 0.2 μm to about 2 μm and comprises a vitreous substance represented by a third formula $A_{x2}B_{y2}CuSi_{z2}O_v$ where about $0.2 < x2 <$ about 0.5, about $0.9 < y2 <$ about 2, about $2 < z2 <$ about 4, and about $4 < v <$ about 10.

8. An oxide superconductor as recited in claim 4, wherein the substrate is made of a fiber.

* * * * *